United States Patent [19]

Langdon et al.

[11] Patent Number: 4,977,482
[45] Date of Patent: Dec. 11, 1990

[54] WATTHOUR METER SOCKET ADAPTER WITH INTERFACE CONNECTION

[75] Inventors: Albert K. Langdon, Rochester Hills; Robert O. Learmont, Walled Lake; Darrell Robinson, Highland; Robert Goozen, St. Clair; Michael Lewis, Ann Arbor; John Williams, Holly; Allen V. Pruehs, Howell, all of Mich.; John T. Shincovich, North Canton, Ohio

[73] Assignee: Ekstrom Industries, Inc., Farmington Hills, Mich.

[21] Appl. No.: 393,129

[22] Filed: Aug. 14, 1989

[51] Int. Cl.$^5$ ............................................. H02B 1/00
[52] U.S. Cl. .................................... 361/366; 324/156; 363/146; 361/364; 361/368
[58] Field of Search ............... 324/710, 114, 142, 156; 361/364, 366, 368, 372–374; 363/146

[56] References Cited

U.S. PATENT DOCUMENTS

| | | | |
|---|---|---|---|
| 2,606,232 | 8/1952 | John | 361/366 |
| 3,067,362 | 12/1962 | Patton | 361/368 |
| 3,714,516 | 1/1973 | Howe | 361/368 |

Primary Examiner—Gregory D. Thompson
Attorney, Agent, or Firm—Basile and Hanlon

[57] ABSTRACT

A watthour meter socket adapter includes a housing with electrical contacts which receive the terminals of a watthour meter and terminals which are insertable into the contacts of an electrical watthour meter socket. First and second seal connectors sealingly connect the adapter housing to the socket and a watthour meter to the adapter housing to control access to the socket, adapter and watthour meter. The interface connection includes an electrical connector mounted in an enclosure and connected to the contacts in the adapter housing to provide electrical power to an external interface. A third seal is connected and attached to the enclosure to control access to the electrical connections housed therein. In one embodiment, the enclosure is separate from and mounted on the adapter housing. In another embodiment, the enclosure is in the form of a sleeve mounted internally within the adapter housing with an open end allowing connection to an external electrical device. A body housing a voltage convertor is removably insertable into the sleeve in the socket adapter housing to convert the electrical power provided to the electrical power connector from AC to DC and to a different voltage level.

14 Claims, 7 Drawing Sheets

WATTHOUR METER SOCKET ADAPTER WITH INTERFACE CONNECTION

BACKGROUND OF THE INVENTION

1. Field of the Invention:

This invention relates, in general, to watthour meters and, specifically, to socket adapters for watthour meters.

Electrical power is supplied to an individual site or service by external electrical power line conductors located above or below ground. In a conventional arrangement, the electrical power line conductors are connected to a watthour meter socket. The supply load electrical conductors are connected to a set of contacts in the socket. A watthour meter is plugged into the socket to measure the electric load or power used at the site or service.

For special applications, such as on-line metering of an individual load, etc., auxillary enclosures or boxes have been attached or mounted to the watthour meter socket and/or socket adapter and contain an electrical outlet or other electrical connector attached to the power line conductors or contacts in the meter socket for powering external devices mounted in the auxillary enclosure. However, the electrical power supplied to the auxillary enclosure is used solely by devices mounted within such enclosure and has not been previously provided to power external devices outside of the auxillary enclosure. Furthermore, access to such auxillary enclosures has solely been available to the electrical utility company.

Telephone service is also supplied to an individual site through telephone line conductors extending from external telephone lines to each individual site. Telephone lines are powered separately from the electrical power line conductors and operate even if electrical power is discontinued or interrupted at the individual site.

A recent innovation in the telephone industry is the use of fiberoptic cables to transmit telephone messages. Such cables have the advantage of significant noise reduction as well as a substantial increase in the number of separate messages which may be transmitted over a single cable. However, fiberoptic cables have only been used in the main distribution networks of the telephone company. They have not yet been applied to radials extending from the distribution lines to each individual site requiring telephone service.

In such fiberoptic telephone systems, optical network interfaces (ONI) have been employed to convert the telephone signal on copper telephone conductors to an optical signal for transmission over the fiberoptic telephone line and vice versa. Each optical network interface requires electric power thus necessitating connection to an electrical power conductor at each individual building or house site. While individual, hard-wired connections may be provided between the electrical power line conductors and an optical network interface at each site, such an installation is costly in terms of installation time and labor as well as requiring local or national wiring codes to be followed at each installation site.

Thus, it would be desirable to provide means for connecting electrical power to an optical network interface at an individual site having telephone service provided through fiberoptic cables which is both easy and inexpensive to install at each site. It would also be desirable to provide means for providing electric power to an interface which provides separate access for the electric utility company and other public services or commercial entities to their respective equipment.

SUMMARY OF THE INVENTION

The present invention is a watthour meter socket adapter having electrical power connections to an interface which provides electric power and other signals to authorized public service or commercial entities from the electric utility network. The socket adapter comprises a housing having a watthour meter receiving portion, a plurality of biased electrical contacts mounted within the watthour meter receiving portion for removably receiving the electrical terminals of a socket-type watthour meter and a plurality of electrical terminals connected to the electrical contacts and extending outward from the housing. The external electrical terminals are removably insertable into the electrical contacts of a conventional watthour meter socket.

First and second means are provided for sealingly connecting the socket adapter housing to the socket to control access to the socket and the socket adapter and for sealingly connecting the watthour meter to the socket adapter housing to control access to the watthour meter and the socket adapter, respectively. The interface connection comprises an electrical connector which is electrically connected to the contacts within the socket adapter housing. An enclosure means surrounds and supports the electrical connector. A third means is provided to control access to the enclosure means for the connection of an electrical connector of an external electrical power usage device, such as an optical network interface, to the electrical power connector mounted in the enclosure.

The first and second sealingly connecting means preferably comprise conventional watthour meter socket sealing rings which surroundingly and lockingly engage flanges on the watthour meter and the socket housing as well as flanges on the socket housing and the watthour meter socket.

In one embodiment, the enclosure surrounding and supporting the electrical power connector is separate from the socket adapter housing and is mounted on and connected to the socket adapter housing. The electrical connector, such as a conventional female, multi-terminal receptacle, is mounted within the enclosure.

In another embodiment, the enclosure means comprises a hollow tubular sleeve mounted in the housing of the socket adapter. The tubular sleeve has an open end opening externally from the socket adapter housing. The electrical connector or outlet is mounted within the tubular sleeve. Cover means are provided for removably covering the open end of the tubular sleeve. Removable seal means sealingly connects the cover means over the open end of the tubular sleeve to control access to the electrical connector mounted within the tubular sleeve. A conductor having a conventional electrical connector, such as a male plug at one end, may be inserted into the tubular sleeve and connected to the electrical connector mounted within the sleeve to connect electrical power to the external device.

In another embodiment, a tubular body has first and second electrical connectors mounted on opposite ends. Electrical power converting means is mounted within the tubular body and connected between the electrical connectors for converting AC electrical power provided at a first voltage level of one of the connectors to AC and/or DC electrical power at a second voltage level at the other connector. The tubular body is inserted into the tubular sleeve in the socket adapter housing such that one connector mates with the electrical connector mounted within the tubular sleeve.

The watthour meter socket adapter with interface connection of the present invention provides an easy and inexpensive means to supply electrical power to an interface at an individual service site. The connection between the contacts of the watthour meter socket adapter and the interface is provided to enable separate access between the electrical power portions of the watthour meter socket adapter and the connection of external devices to the interface. This allows the electric power utility and authorized public service or commercial entities separate and convenient access to their respective connections.

The watthour meter socket adapter with interface connection of the present invention provides any type of connection between the interface and the watthour meter socket adapter. Various voltage levels and either AC and/or DC electric power may be provided by means of a tubular body housing a voltage conversion means which is slidably insertable into the tubular sleeve in one embodiment of the present invention.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1:
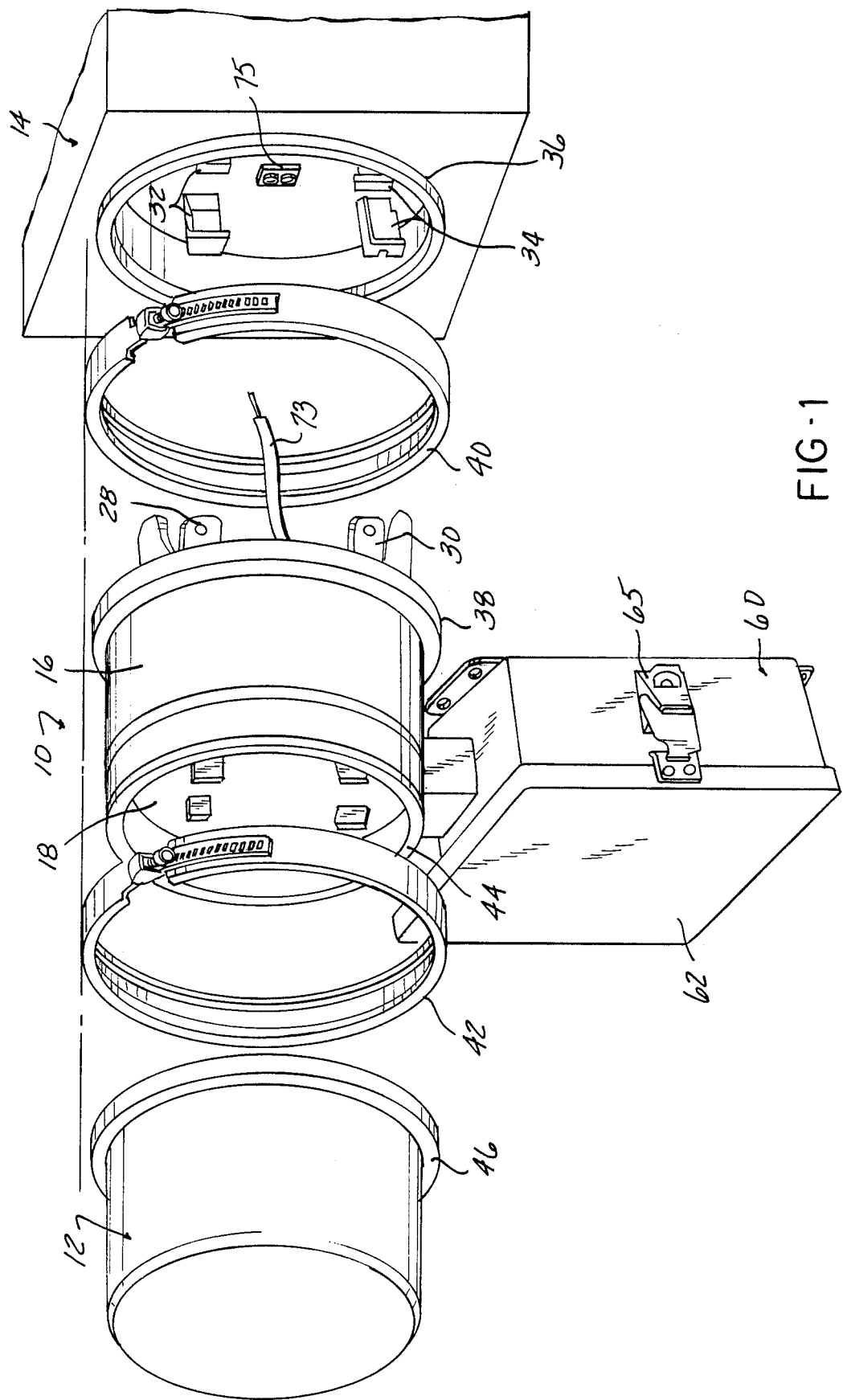
FIG. 1 is an exploded, perspective view of one embodiment of a watthour meter socket adapter with interface connection utilized with a standard socket-type watthour meter and a watthour meter socket.

Throughout the following description and drawing, an identical reference number is used to refer to the same component shown in multiple figures of the drawing.

The present invention, as shown in FIG. 1, is a watthour meter socket adapter with interface connection which provides electrical power to an interface connectable to external devices.

As shown in FIG. 1, the watthour meter socket adapter with interface connection 10 is employed with a conventional electrical watthour meter 12 and a watthour meter socket 14. Since the watthour meter 12 and the watthour meter socket 14 are conventional, their detailed construction will not be provided herein except where necessary to explain connections to the watthour meter socket adapter 10.

The watthour meter socket adapter 10 includes a housing 16 having a watthour meter receiving portion 18 formed at one end thereof. As shown in both FIGS. 1 and 2, a plurality of biased electrical contacts are mounted within the watthour meter receiving portion 18 of the housing 16 for removably receiving the blade-type electrical terminals of the socket-type watthour meter 12. The electrical contacts are provided in any number, type and arrangement depending on the requirements of a particular application. By way of example only, the electrical contacts are arranged in a first pair of contacts 20 and 22 and a second pair of contacts 24 and 26. Each of the contacts 20, 22, 24 and 26 receives one of the blade-type electrical terminals mounted on and extending outward from the watthour meter 12. Each of the contacts 20, 22, 24 and 26 is preferably in the form of a pair of spring-biased fingers which are formed of an electrically conductive material.

Two pairs of blade-type electric terminals, such as terminals 28 and 30 shown in FIG. 1, are mounted in and extend outward from the watthour meter socket adapter housing 16. The blade-type terminals 28 and 30 are connected to the contacts 20, 22, 24 and 26 and are releasably insertable into pairs of electrical contacts 32 and 34 mounted in the watthour meter socket 14. The first pair of electrical contacts 32 are the line contacts and are connected to the incoming electrical power line conductors. The second pair of contacts 34 are the load contacts and are connected to an individual service wiring conductors. In addition, a neutral connector 75 is provided in the socket 14 to connect the neutrals of the system together.

An external projection or flange 36 is formed on the watthour meter socket 14 which mates with a similarly formed flange 38 on the watthour meter socket adapter housing 16 for connection and mounting of the watthour meter socket adapter 16 to the watthour meter socket 14. A first means 40 is provided for controlling access to the watthour meter socket adapter housing 16 and the watthour meter socket 14. The first access controlling means 40 may be any conventional seal or clamp ring, such as the seal ring disclosed in U.S. patent application Ser. No. 07/356,252, assigned to the assignee of the present application.

The adapter housing 16 and socket 14 may also be configured for a ringless connection. In this type of connection, not shown, the cover of the socket 14 is provided with an aperture which is disposable over the adapter housing 16 and locked to the socket enclosure after the adapter housing 16 has been inserted into the socket 14. The lockable cover forms the first means for controlling access to the adapter housing 16 and the socket 14.

A second means for controlling access, denoted by reference number 42, is associated with a mounting flange 44 formed on the peripheral edge of the watthour meter receiving portion 18 of the housing 16 and a similar flange 46 formed on the watthour meter 12. The second access controlling means 42 may likewise be a conventional sealing or clamp ring which controls access to the watthour meter 12 and the watthour meter receiving portion 18 of the watthour meter socket adapter 10.

An optional electrical wire conductor 73 may exit the adapter housing 16, as shown in FIG. 1, at the center of the flange 38 and can be attached to the neutral connector 75 of the socket 14 during installation of the adapter 10.

Figure 2:
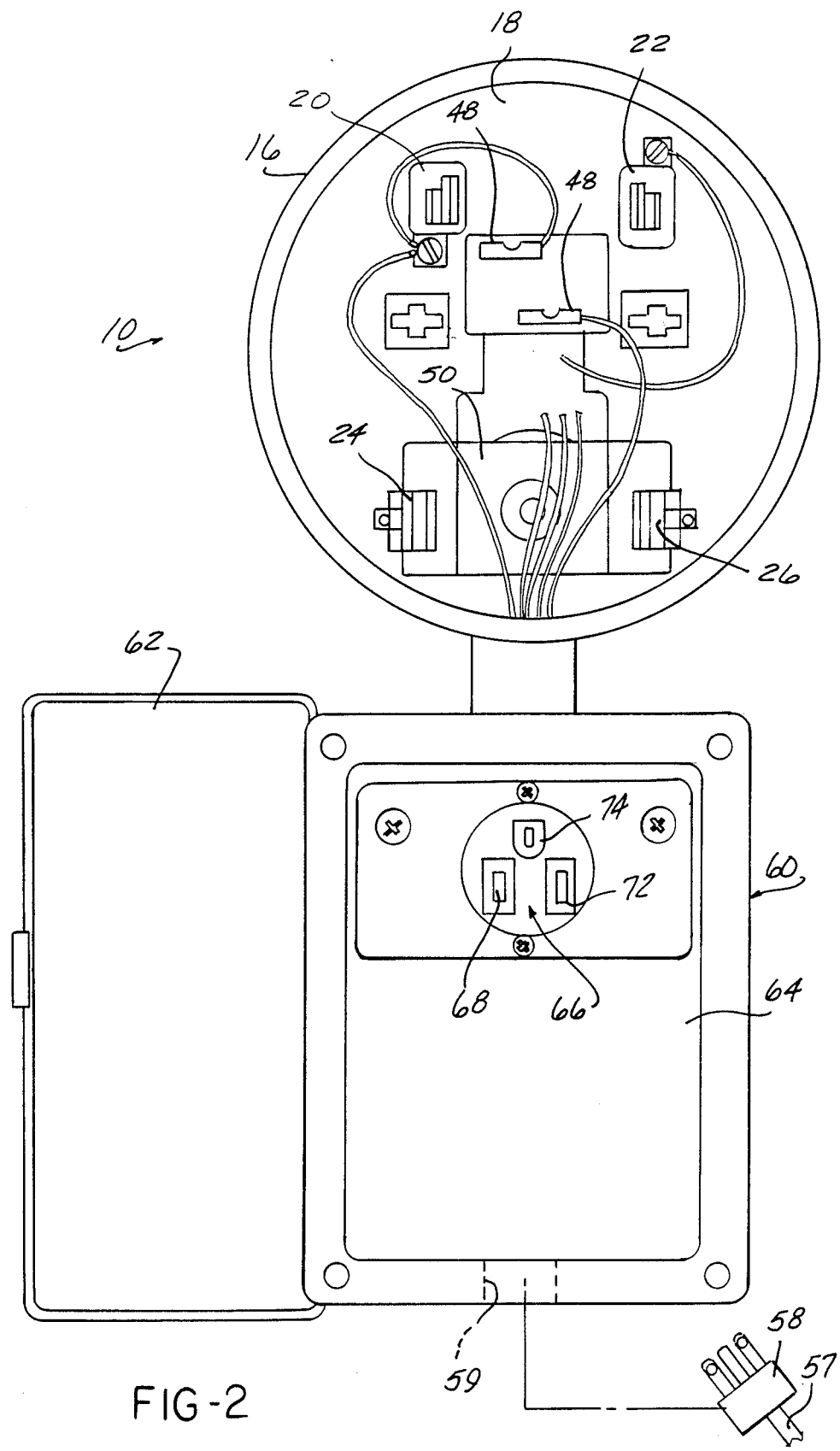
FIG. 2 is a front, elevational view of the watthour meter socket adapter shown in FIG. 1.

As shown in FIG. 2, circuit breaker means 48 is mounted within the watthour meter socket adapter housing 16. Also, a power disconnect switch means 50 with a pair of switchable contacts is optionally mounted within the housing 14. The circuit breaker means 48 functions to limit power output from the adapter housing 16. The power disconnect switch 50 enables a utility company to disconnect power supplied to an individual service site without first removing the watthour meter 12.

In one embodiment of the present invention shown in FIGS. 1 and 2, the interface connection includes an enclosure 60 mounted on and disposed in internal communication with the components within the housing 16 of the watthour meter socket adapter 10. The enclosure 60 preferably comprises a box-like housing having top, bottom, side and back walls. A cover or front wall 62 is hingedly attached to one of the side walls of the enclosure 60 to provide access to the interior 64 of the housing 60 via a releasable latch 65 mounted externally on the housing 60.

According to the present invention, an electrical connector 66 is mounted within the enclosure 60 and electrically connected to one of the set of contacts 20 and 22 or 24 and 26 of the watthour meter socket adapter 10 to provide electrical power to an external electrical power usage device, such as an optical network interface. In a preferred embodiment, the electrical connector 66 is in the form of a conventional female-type receptacle having three recesses 68, 72 and 74 for receiving the male contacts of a plug or mating electrical connector. It should be noted that the number of recesses as well as the orientation and arrangement of the recesses may be varied as desired.

Figure 3:
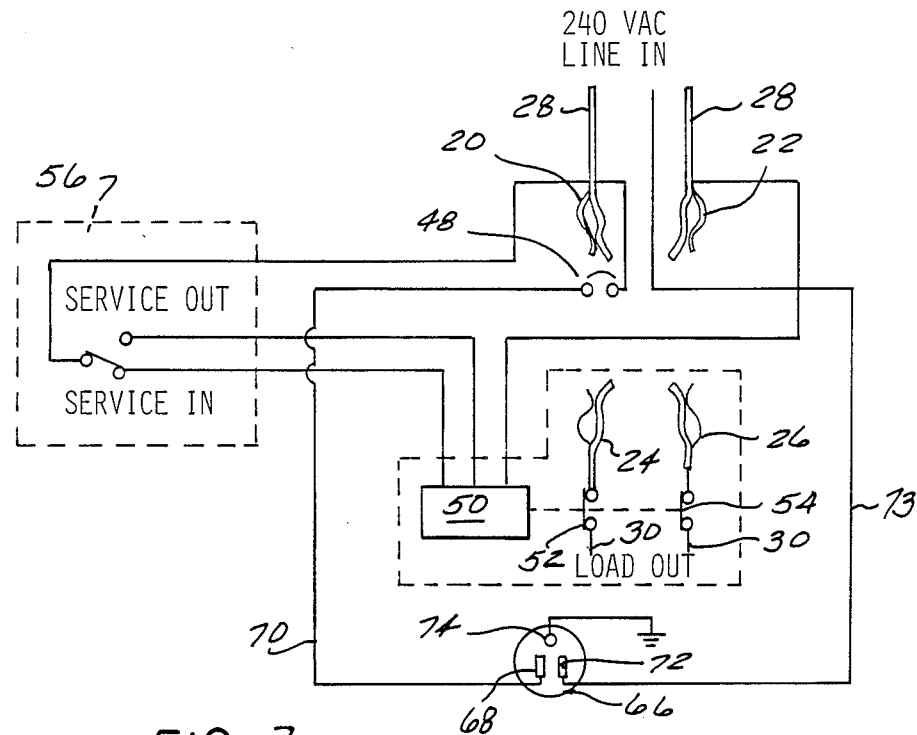
FIG. 3 is a schematic diagram of the connection of the components of the watthour meter socket adapter with interface connection shown in FIG. 1.

FIG. 3 depicts the connection of the electrical connector 66 to the electrical line contact 20 within the watthour meter socket adapter housing 16. It will be understood that the connector 66 may optionally be connected to the load contacts 24 and 26. As shown in FIG. 3, the recess 68 in the connector 66 is directly connected via a conductor 70 through a circuit breaker 48 to the electrical line contact 20. One of the other recesses, such as recess 72, is connected to neutral via neutral conductor wire 73; while the third recess 74 is connected to ground. This connection provides electrical power, such as 120 volt AC power, for example, to the electrical connector 66. Alternately, the recess 72 could be connected through a second circuit breaker 48 to the line contact 22 to provide 240 volt AC power to the connector 66.

The power disconnect switch 50 includes two switchable contacts 52 and 54 which are connected between load contacts 24 and 26, respectively, and the load conductors 30. Activation of the disconnect switch 50 causes the contacts 52 and 54 to open and thereby disconnect power to the individual service site. The switch 50 can be activated in any suitable manner, such as by a switch 56. The switch 56 can be activated by radio frequency signals or by signals over the telephone line conductors from the electrical utility as is conventionally known.

Figure 4:
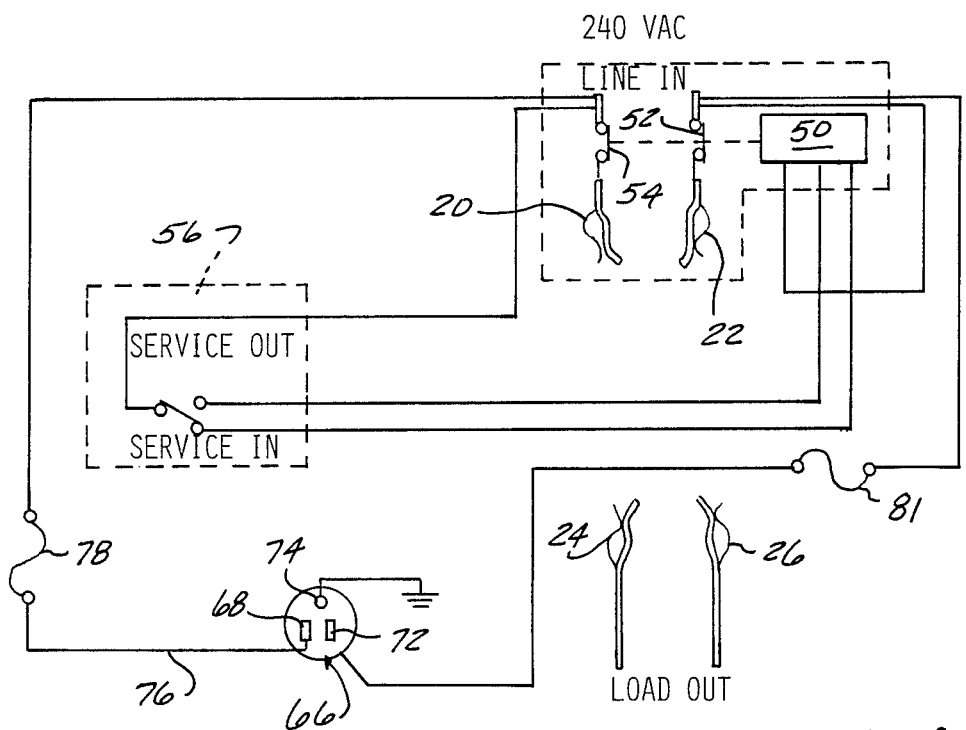
FIG. 4 is a schematic diagram of an alternate connection of the components of the watthour meter socket adapter with interface connection shown in FIG. 1.
Figure 5:
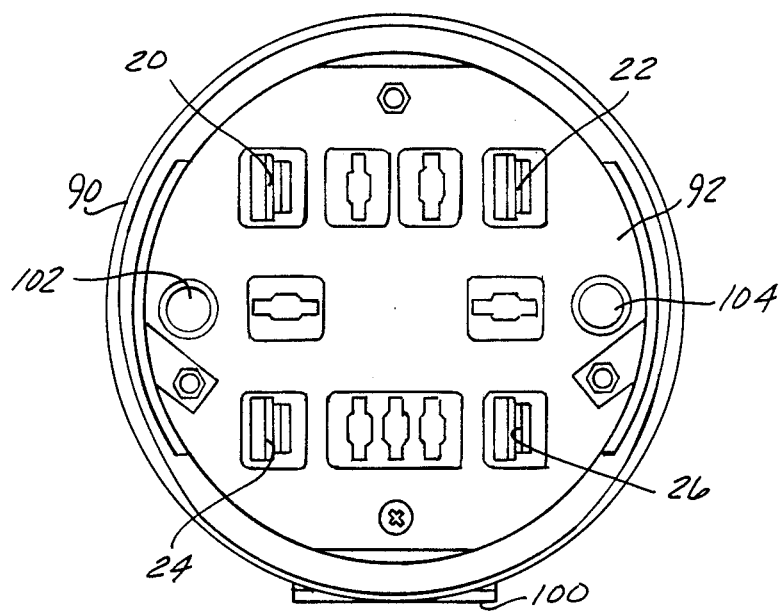
FIG. 5 is a front, elevational view of another embodiment of a watthour meter socket adapter with interface connection.
Figure 6:
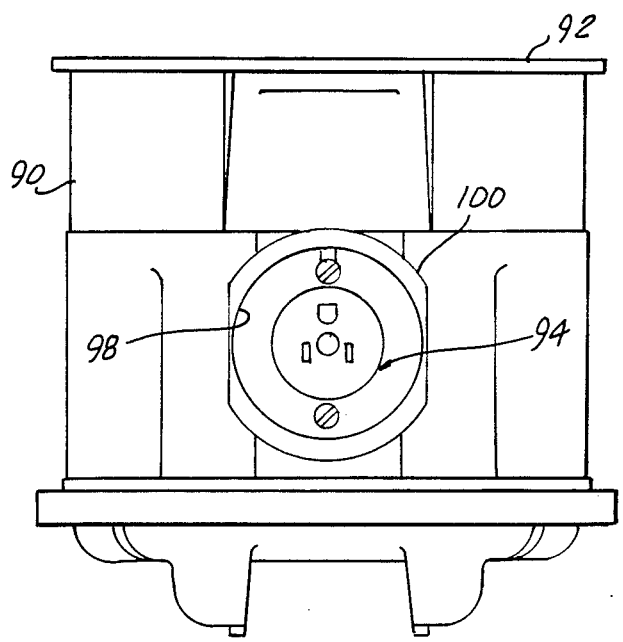
FIG. 6 is a bottom view of the watthour meter socket adapter shown in FIG. 5.

An alternate electrical connection is shown in FIG. 4 in which like reference numerals are used with the same component. In this arrangement, an electrical conductor 76 connected to the electrical recess 68 in the electrical connector 66 is connected through a fuse or circuit breaker 78 to the switchable contact 54 of the remote control disconnect switch 50. The switchable contact 54 is shown connected to the contact 20 in the watthour meter socket adapter 10. The other recess 72 is connected through a fuse 81 to the opposite switchable contact 52 of the remote disconnect switch 50. This switchable contact 52 is connected to the opposite contact 22 of the line pair of contacts in the watthour meter socket adapter 10.

As shown in FIG. 2, an external conductor 57 connected to an external electrical device, such as an optical network interface, not shown, has an electrical connector, such as a male plug 58, mounted at one end. The plug 58 and conductor 57 are insertable through an aperture 59 formed in one wall of the enclosure 60 and removably inserted in the connector 66 to connect electrical power to the external device. A strain relief, not shown, may be provided to secure the conductor 57 to the enclosure 60 where it passes through the aperture 59.

FIGS. 5–9 depict a second embodiment of the present invention in which the interface is housed internally within the watthour meter socket adapter housing 16. The socket adapter housing 90 is substantially similar to that shown in FIGS. 1 and 2 and includes two sets of electrical contacts 20 and 22, and 24 and 26 which receive the blade-type terminals of the watthour meter 12. Externally extending blade-type terminals 28 and 30, arranged in spaced pairs, are also mounted on the housing 90 and extend outward from the housing 90 for slidable insertion into the mating contacts in the watthour meter socket 14, as described above.

In this embodiment, an external electrical connector 94 is mounted at one end of a hollow, tubular sleeve 96 which is disposed internally within the housing 90 of the watthour meter socket adapter. The tubular sleeve 96 has an open end 98 facing outward from the housing 90 and is mounted in the housing 90 through a side wall of the housing 90. The tubular sleeve 96 has an enlarged diameter end 100 which is disposed externally from the side wall of the housing 90 to form a lip which receives a seal means, such as a connector seal nut, as described hereafter.

Figure 7:
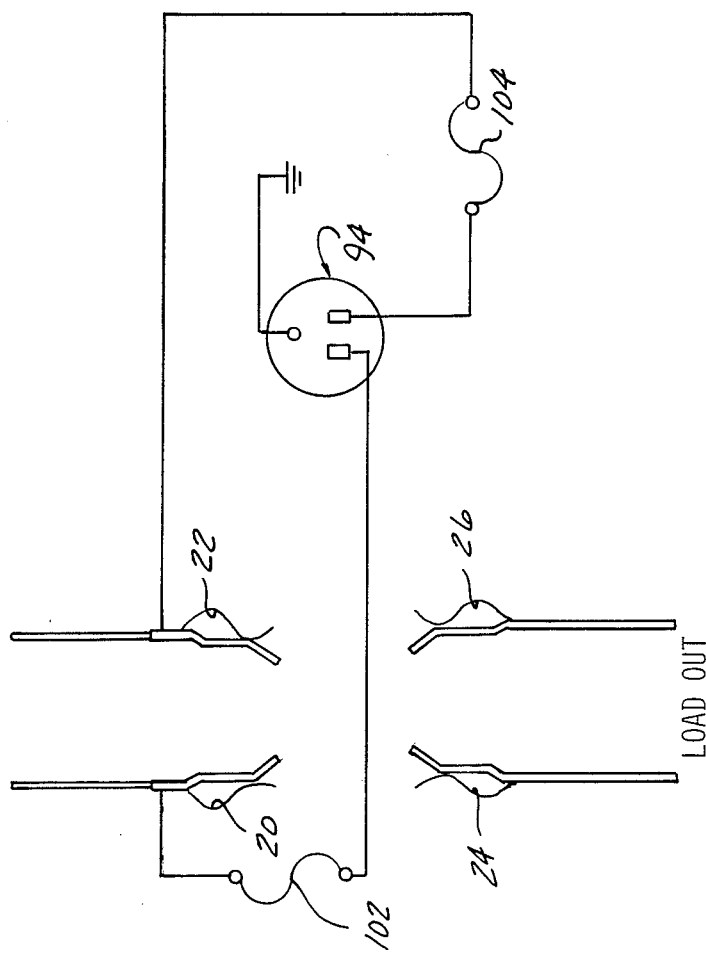
FIG. 7 is a schematic diagram of one embodiment of the electrical power circuitry employed in the watthour meter socket adapter shown in FIG. 5.

The electrical connector 94 is preferably in the form of a female-type receptacle substantially identical to the connector 66 shown in FIGS. 1 and 2 and described above. The electrical connector 94 is provided with a plurality of recesses connected to terminals which are in turn electrically connected by wires or conductors to certain of the contacts 20, 22, 24 and 26 in the electrical watthour meter socket adapter housing as shown in FIG. 7. FIG. 7 depicts an example of an electrical connection of the electrical connector 94 to the line pair of contacts 20 and 22 through fuses 102 and 104 to supply 240 volt AC power. The third recess in the electrical connector 94 is connected to ground. Alternately, the electrical connector 94 may be connected in any of the configurations shown in FIGS. 3 and 4 if circuit breakers or a disconnect switch is employed in the watthour meter socket adapter housing 90 or connected to supply 120 volt AC, 240 volt AC power or other voltages as needed.

Figure 8:
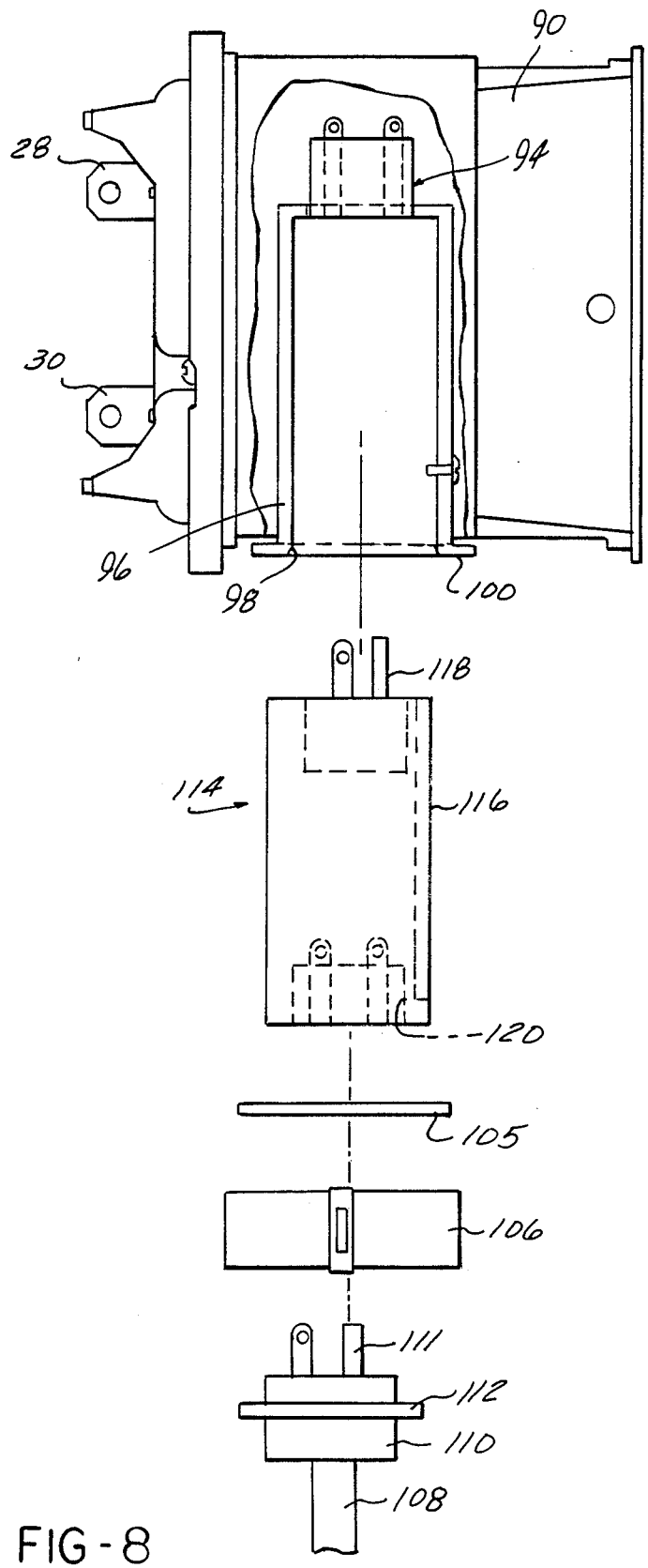
FIG. 8 is an exploded, side, elevational view of the watthour meter socket adapter shown in FIG. 5 with a tubular body housing a voltage converting means removably insertable thereinto.

A cover means 105, FIG. 8, is in the form of a planar member having substantially the same shape as the external enlarged end portion 100 of the tubular sleeve 96. The cover means 105 is matable with the enlarged end portion 100 of the sleeve 96 and is sealingly connected thereto by a third access controlling means, such as access controlling means 106. The access controlling means 106 may take the form of any conventional seal or clamp member, such as the connector seal nut shown in U.S. Pat. Nos. 4,544,190 or 4,600,220. This type of connector is formed of two mating sections which surround and releasably engage the cover 105 and the flange 100 on the tubular sleeve 96 to secure the cover 105 to the tubular sleeve 96 and close off the open end 98 of the tubular sleeve 96.

When electrical connection is to be made to the electrical power connector 94 mounted at one end of the tubular sleeve 96 to supply power to an external device, the seal nut 106 and the cover 105 are removed from the tubular sleeve 96. An electrical conductor 102 having a conventional male plug 110 mounted at one end may then be inserted through the tubular sleeve 96 into mating engagement with the recesses in the electrical connector 94 to supply electrical power through the electrical conductor 102 to the external device, such as an optical network interface. An annular flange 112 may be formed on the body of the plug 110 to enable the plug 110 to be connected to the enlarged end portion 100 of the tubular sleeve 96 by means of the connector seal nut 106. In this manner, access to the connections of the electrical power connector 94 may be controlled.

Figure 9:
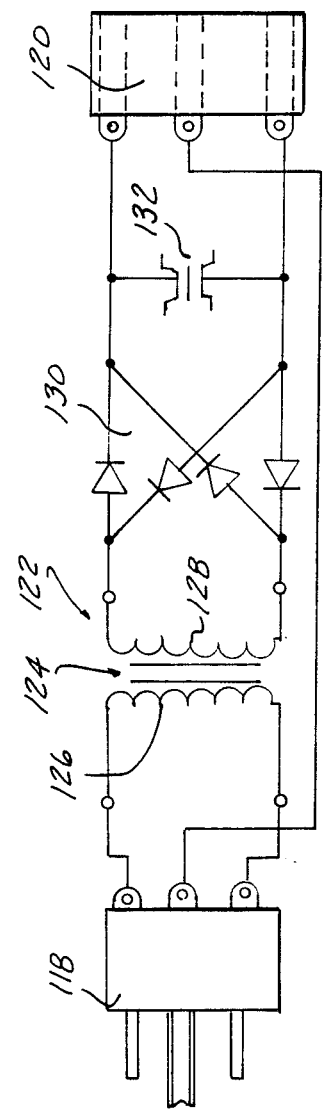
FIG. 9 is a schematic diagram of the voltage converting means mounted within the tubular body shown in FIG. 8.

As shown in FIGS. 8 and 9, the present invention in another embodiment includes voltage converting means denoted in general by reference number 114. The voltage converting means includes a tubular, hollow housing 116 which is slidably insertable into the tubular sleeve 96 mounted within the socket adapter housing 90. A first electrical connector 118, such as a male-type connector having a plurality of outwardly extending contacts is mounted at one end of the tubular body 116. A second electrical connector 120, such as a female-type receptacle, is mounted at the opposite end of the tubular body 116. Preferably, the second electrical connector 120 is configured to receive the male contacts 111 of the plug 110.

As shown in FIG. 9, a voltage converting circuit 122 is connected between the first and second electrical connectors 118 and 120 and preferably comprises a transformer 124 having a primary winding 126 and a secondary winding 128. The primary winding 126 is connected to the first electrical connector 118. The secondary winding 128 is connected through a conventional diode rectifier bridge 130 and a parallel connected pair of capacitors 132 to the terminals on the second electrical connector 120. The transformer 124 transforms the voltage between the first and second electrical connectors 118 and 120; while the rectifier bridge 130 converts the AC electrical power provided at the first connector 118 to DC electrical power at the second connector 120. Thus, AC power at any magnitude supplied at the first electrical connector 118 when the connector 118 is inserted into the electrical connector 94 is converted to any DC electric power level, such as twenty-four volts or forty-eight volts, depending upon the particular power needs of the optical network interface. Alternately, AC power at a second level may be provided at the second connector 120 if the rectifier 130 is not employed. Optionally, power conditioner devices may be mounted in the housing 116 to prevent surges, etc.

Figure 10:
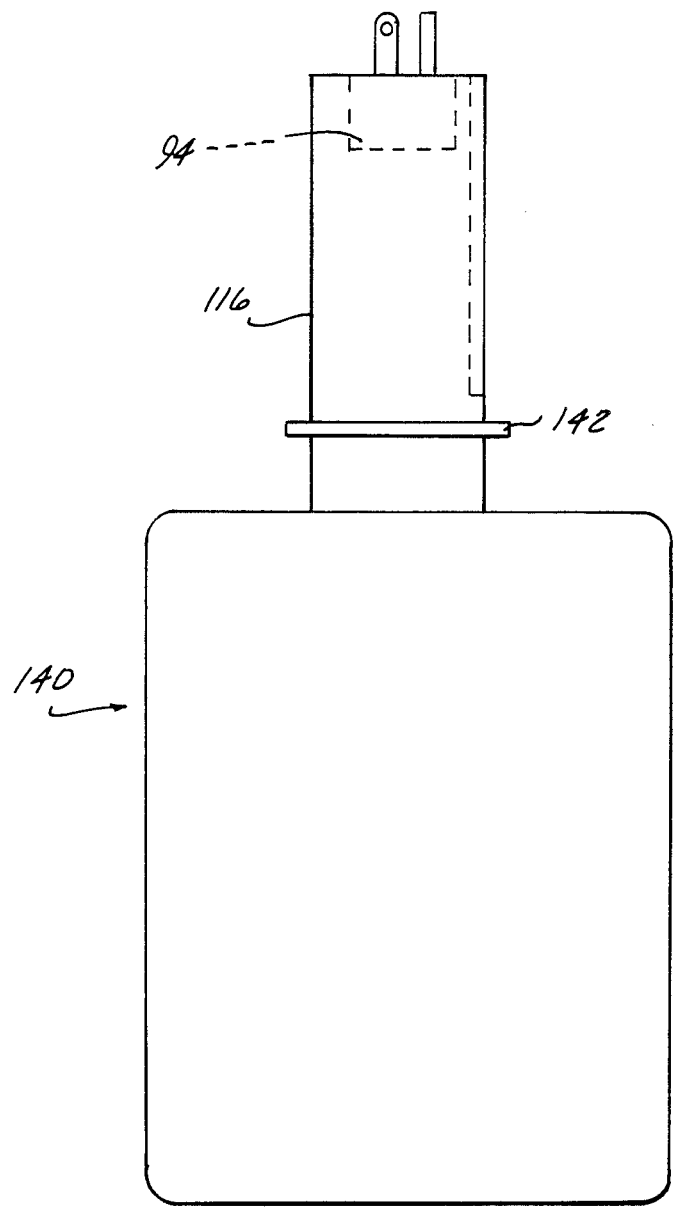
FIG. 10 is a front elevational view of another embodiment of the tubular body shown in FIG. 8.

As shown in FIG. 10, a separate housing 140 may be integrally or removable connected to one end of the tubular housing 116. The housing 140 contains any power supply or circuitry required by an external device obtaining power through the connector 94. Separate connectors 120 and 110 may be employed between the housing 140 and the tubular housing 116 or the rectifier bridge 130 may be directly wired to the components within the housing 140.

An annular flange 142 is formed on the tubular housing 116 and is engagable with the end portion 100 of the tubular sleeve 96 and a seal means to sealingly connect the housing 116 and 140 to the socket adapter housing 90.

In summary, there has been disclosed a unique watthour meter socket adapter with interface connection which provides a simple and inexpensive arrangement for supplying electrical power to an interface connected between conventional telephone copper conductors and fiberoptic telephone cables. The present invention may be employed with any electric power connections utilizing conventional socket-type watthour meters and watthour meter sockets. The watthour meter socket adapter with interface connection of the present invention also provides access to the interface connections separate from the electrical power connections associated with the watthour meter thereby enabling separate access by an electric utility company and an authorized public service or commercial entity to their respective connections independent from each other.

What is claimed is:

1. A watthour meter socket adapter removably mountable in a watthour meter socket having a plurality of electrical contacts and receiving the terminals of a sockettype watthour meter, and further including a first seal means for sealingly connecting the socket adapter to the watthour meter socket to control access to the watthour meter socket and the socket adapter and a second seal means for sealingly connecting a watthour meter to the socket adapter to control access to the socket-type watthour meter and the socket adapter, the socket adapter comprising:

a first housing, the first housing comprising:
   a socket-type watthour meter receiving portion;
   a plurality of electrical contacts mounted in the watthour meter receiving portion for removably receiving the electrical terminals of a socket-type watthour meter; and
   a plurality of electrical terminals connected to the electrical contacts and extending outward from the first housing, the terminals being removably insertable within the electrical contacts of a watthour meter socket;

electrical connector means electrically connected to the contacts within the first housing for matingly receiving an electrical connector of an electrical device external to the watthour meter socket, the watthour meter socket adapter and the socket-type watthour meter;

a second housing supporting the electrical connector means; and third means for separately and sealingly closing the second housing to control access to the second housing independently from access to the watthour meter socket, the watthour meter socket adapter and the socket-type watthour meter through the first and second seal means.

2. The watthour meter socket adapter of claim 1 wherein:
the electrical connector means is a female-type electrical receptacle and the electrical connector of the external electrical device is a mating electric plug having male contacts.

3. The watthour meter socket adapter of claim 1 wherein:
the second housing is mounted externally on the first housing;
an opening is formed in the second housing; and the third means comprises:
cover means removably covering the opening in the second housing; and
latch means for latchingly connecting the cover means to the second housing.

4. A watthour meter socket adapter removably mountable in a watthour meter socket having a plurality of electrical contacts and receiving the terminals of a socket-type watthour meter, the socket adapter comprising:
a first housing, the first housing comprising:
a watthour meter receiving portion;
a plurality of electrical contacts mounted in the watthour meter receiving portion for removably receiving the electrical terminals of a socket-type watthour meter; and
a plurality of electrical terminals connected to the electrical contacts and extending outward from the first housing, the terminals being removably insertable within the electrical contacts of a watthour meter socket;
first means for sealingly connecting the first housing to the watthour meter socket to control access to the watthour meter socket and the socket adapter;
second means for sealingly connecting the watthour meter to the first housing to control access to the watthour meter and the socket adapter;
an electrical connector electrically connected to the contacts within the first housing; and
a second housing and supporting the electrical connector, the second housing including:
a hollow sleeve mounted in the first housing of the socket adapter, the sleeve having an open end opening externally from the first housing;
the electrical connector mounted in the sleeve;
cover means removably covering the open end of the sleeve; and
removable seal means for sealingly connecting the cover means over the open end of the sleeve to control access to the second housing for the connection of an external electrical connector of an external electrical device to the electrical connector in the second housing.

5. The watthour meter socket adapter of claim 4 further including:
a body;
a first electrical connector mounted at one end of the body and removably insertable into the electrical connector in the sleeve in the first housing;
a second electrical connector mounted at the other end of the body; and
electrical power converting means mounted in the body and connected between the first and second electrical connectors for converting electrical power at a first voltage level from the first electrical connector to electric power at a second voltage level at the second electrical connector.

6. The watthour meter socket adapter of claim 5 wherein the electrical power converting means comprises:
a transformer having primary and secondary windings, the primary winding connected to the first electrical connector mounted in the body; and
bridge rectifier means, connected between the secondary winding of the transformer and the second electrical connector in the body, for converting AC electrical power to DC electrical power.

7. A watthour meter socket adapter removably mountable in a watthour meter socket having a plurality of electrical contacts and receiving the terminals of a sockettype watthour meter, and further including a first seal means for sealingly connecting the socket adapter to the watthour meter socket to control access to the watthour meter socket and the socket adapter and a second seal means for sealingly connecting a watthour meter to the socket adapter to control access to the socket-type watthour meter and the socket adapter, the socket adapter comprising:
a housing, the housing comprising:
a socket-type watthour meter receiving portion;
a plurality of electrical contacts mounted in the watthour meter receiving portion for removably receiving the electrical terminals of a socket-type watthour meter; and
a plurality of electrical terminals connected to the electrical contacts and extending outward from the housing, the terminals being removably insertable within the electrical contacts of a watthour meter socket;
a hollow sleeve mounted in the housing of the socket adapter, the sleeve having an open end opening externally from the socket adapter housing;
an electrical connector mounted within the sleeve and electrically connected to the contacts within the socket adapter housing;
cover means releasably mountable over the open end of the sleeve;
third access controlling means for releasably attaching the cover means to the sleeve to control access to the electrical connector mounted within the sleeve;
a body;
a first electrical connector mounted at one end of the body and removably insertable into the electrical connector mounted in the sleeve in the socket adapter housing;
a second electrical connector mounted on the opposite end of the body for removably receiving an electrical connector attached to an external electrical device; and
electrical power converting means mounted in the body and connected between the first and second electrical connectors for converting electrical power at a first voltage level to electrical power at a second voltage level.

8. A watthour meter assembly comprising:
a watthour meter socket having a plurality of electrical contacts;

a socket-type watthour meter having a plurality of outwardly extending terminals;

a watthour meter socket adapter removably mountable between the watthour meter socket and the socket-type watthour meter;

first seal means for sealingly connecting the watthour meter socket adapter to the watthour meter socket to control access to the watthour meter socket and the watthour meter socket adapter; and second seal means for sealingly connecting the watthour meter to the watthour meter socket adapter to control access to the watthour meter and the watthour meter socket adapter;

the watthour meter socket adapter including:

a first housing, the first housing comprising
 (a) a socket-type watthour meter receiving portion;
 (b) a plurality of electrical contacts mounted in the watthour meter receiving portion for removably receiving the electrical terminals of the socket-type watthour meter; and
 (c) a plurality of electrical terminals connected to the electrical contacts and extending outward from the first housing, the terminals being removably insertable within the electrical contacts of the watthour meter socket;

electrical connector means electrically connected to the contacts within the first housing, for matingly receiving an electrical connector of an electrical device external to the watthour meter socket, the watthour meter socket adapter and the socket-type watthour meter;

a second housing supporting the electrical connector means; and third means for separately and sealingly closing the second housing to control access to the second housing independently from access to the watthour meter socket, the watthour meter socket adapter and the socket-type watthour meter.

9. The watthour meter assembly of claim 8 wherein:
the electrical connector means is a female-type electrical receptacle and electrical connector of the external electrical device is a mating electric plug having male contacts.

10. The watthour meter assembly of claim 8 wherein:
the first and second seal means comprise seal rings.

11. The watthour meter assembly of claim 8 wherein:
the second housing is mounted externally on the first housing;
an opening is formed in the second housing; and
the third comprises:
 cover means removably covering the opening in the second housing; and
 latch means for latchingly connecting the cover means to the second housing.

12. The watthour meter assembly of claim 8 wherein the second housing comprises:
a hollow sleeve mounted in the first housing of the watthour meter socket adapter, the sleeve having an open end opening externally from the first housing;
the electrical connector means mounted in the sleeve;
cover means removably covering the open end of the sleeve; and
removable seal means for sealingly connecting the cover means over the open end of the sleeve in the second housing.

13. The watthour meter assembly of claim 12 further including:
a body slidably insertable into the sleeve;
a first electrical connector mounted at one end of the body and removably insertable into the electrical connector in the sleeve first housing;
a second electrical connector mounted at the other end of the body; and
electrical power converting means mounted in the body and connected between the first and second electrical connectors for converting electrical power at a first voltage level from the first electrical connector to electric power at a second voltage level at the second electrical connector.

14. The watthour meter assembly of claim 13 wherein the electrical power converting means comprises:
a transformer having primary and secondary windings, the primary winding connected to the first electrical connector mounted in the body; and
bridge rectifier means, connected between the secondary winding of the transformer and the second electrical connector in the body, for converting AC electrical power to DC electrical power.

* * * * *